(12) United States Patent
McLaurin et al.

(10) Patent No.: US 10,566,766 B1
(45) Date of Patent: *Feb. 18, 2020

(54) MAGNESIUM BASED GETTERING REGIONS FOR GALLIUM AND NITROGEN CONTAINING LASER DIODE DEVICES

(71) Applicant: Soraa Laser Diode, Inc., Goleta, CA (US)

(72) Inventors: Melvin McLaurin, Santa Barbara, CA (US); James W. Raring, Santa Barbara, CA (US); Christiane Elsass, Goleta, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/219,689

(22) Filed: Dec. 13, 2018

Related U.S. Application Data

(63) Continuation of application No. 15/728,374, filed on Oct. 9, 2017, now Pat. No. 10,199,802, which is a continuation of application No. 15/298,583, filed on Oct. 20, 2016, now Pat. No. 9,787,060, which is a continuation of application No. 14/593,259, filed on
(Continued)

(51) Int. Cl.
*H01S 5/32* (2006.01)
*H01S 5/343* (2006.01)
*H01S 5/323* (2006.01)

(52) U.S. Cl.
CPC .......... *H01S 5/3202* (2013.01); *H01S 5/3211* (2013.01); *H01S 5/32341* (2013.01); *H01S 5/34333* (2013.01); *H01S 5/34386* (2013.01)

(58) Field of Classification Search
CPC .... H01S 5/2205; H01S 5/3063; H01S 5/3202; H01S 5/32341
See application file for complete search history.

(56) References Cited

U.S. PATENT DOCUMENTS 8,740,413 B1  6/2014  Krames et al.
8,964,807 B1 * 2/2015  McLaurin ............. H01S 5/2205
                                                          372/44.01
(Continued)

OTHER PUBLICATIONS

U.S. Appl. No. 13/890,431, Notice of Allowance dated Oct. 10, 2014, 11 pages.
(Continued)

*Primary Examiner* — Michael Carter
(74) *Attorney, Agent, or Firm* — Kilpatrick Townsend & Stockton LLP

(57) ABSTRACT

In an example, the present invention provides a gallium and nitrogen containing laser diode device. The device has a gallium and nitrogen containing substrate material comprising a surface region, which is configured on either a ({10-10}) crystal orientation or a {10-10} crystal orientation configured with an offcut at an angle toward or away from the [0001] direction. The device also has a GaN region formed overlying the surface region, an active region formed overlying the surface region, and a gettering region comprising a magnesium species overlying the surface region. The device has a p-type cladding region comprising an (InAl)GaN material doped with a plurality of magnesium species formed overlying the active region.

20 Claims, 8 Drawing Sheets

Related U.S. Application Data

Jan. 9, 2015, now Pat. No. 9,502,859, which is a continuation of application No. 13/890,431, filed on May 9, 2013, now Pat. No. 8,964,807.

(56) References Cited

U.S. PATENT DOCUMENTS

| | | | |
|---|---|---|---|
| 9,502,859 B1 * | 11/2016 | McLaurin | H01S 5/2205 |
| 9,787,060 B1 * | 10/2017 | McLaurin | H01S 5/2205 |
| 10,199,802 B1 * | 2/2019 | McLaurin | H01S 5/2205 |
| 2010/0302464 A1 * | 12/2010 | Raring | H04N 9/3129 |
| | | | 348/744 |
| 2010/0309943 A1 | 12/2010 | Chakraborty et al. | |
| 2011/0186874 A1 | 8/2011 | Shum | |
| 2012/0076165 A1 | 3/2012 | Chakraborty et al. | |

OTHER PUBLICATIONS

U.S. Appl. No. 14/593,259, Non-Final Office Action dated Mar. 4, 2016, 6 pages.

U.S. Appl. No. 14/593,259, Notice of Allowance dated Jul. 22, 2016, 7 pages.

U.S. Appl. No. 15/298,583, First Action Interview Pilot Program Pre-Interview Communication dated Mar. 27, 2017, 4 pages.

U.S. Appl. No. 15/298,583, Notice of Allowance dated Jun. 13, 2017, 10 pages.

U.S. Appl. No. 15/728,374 Non-Final Office Action dated Apr. 30, 2018, 8 pages.

U.S. Appl. No. 15/728,374 Notice of Allowance dated Sep. 21, 2018, 7 pages.

* cited by examiner

MAGNESIUM BASED GETTERING REGIONS FOR GALLIUM AND NITROGEN CONTAINING LASER DIODE DEVICES

CROSS-REFERENCES TO RELATED APPLICATIONS

This application is a continuation of U.S. patent application Ser. No. 15/728,374, filed Oct. 9, 2017, which is a continuation of U.S. patent application Ser. No. 15/298,583, filed Oct. 20, 2016, which is a continuation of U.S. patent application Ser. No. 14/593,259, filed Jan. 9, 2015, which is a continuation of U.S. patent application Ser. No. 13/890,431, filed May 9, 2013, the entire contents of each of which are incorporated by reference herein for all purposes.

FIELD

The present invention relates to gallium and nitrogen containing laser diode devices. The devices include a gallium and nitrogen containing substrate material comprising a surface region, which is configured on either a non-polar ({10-10}) crystal orientation or a semi-polar ({10-10} crystal orientation configured with an offcut at an angle toward or away from the [0001] direction). The devices also have a GaN region formed overlying the surface region, an active region formed overlying the surface region, and a gettering region comprising a magnesium species overlying the surface region. The devices have a p-type cladding region comprising an (InAl)GaN material doped with a plurality of magnesium species formed overlying the active region.

BACKGROUND

The present application relates to U.S. application Ser. No. 13/019,897 filed on Feb. 2, 2011, and U.S. application Ser. No. 13/328,978 filed on Dec. 16, 2011, each of which is incorporated by reference in its entirety.

The present disclosure relates generally to optical techniques. More specifically, the present disclosure provides methods and devices using semi-polar oriented gallium and nitrogen containing substrates for optical applications.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of about 1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5% to 10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal, which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application.

From the above, it is seen that techniques for improving optical devices is highly desired.

SUMMARY

In an example, the present invention provides a gallium and nitrogen containing laser diode device. The device has a gallium and nitrogen containing substrate material comprising a surface region, which is configured on either a non-polar ({10-10}) crystal orientation or a semi-polar ({10-10} crystal orientation configured with an offcut at an angle toward or away from the [0001] direction). The device also has a GaN region formed overlying the surface region, an active region formed overlying the surface region, and a gettering region comprising a magnesium species overlying the surface region. The device has a p-type cladding region comprising an (InAl)GaN material doped with a plurality of magnesium species formed overlying the active region.

In an alternative example, the present invention provides a method of manufacturing a gallium and nitrogen containing laser diode device. The method includes providing a gallium and nitrogen containing substrate material comprising a surface region, which is configured on either a non-polar ({10-10}) crystal orientation or a semi-polar ({10-10} crystal orientation configured with an offcut at an angle toward or away from the [0001] direction such as a {40-4-1} plane, a {40-41} plane, a {30-3-1} plane, a {30-31} plane, a {20-2-1} plane, a {20-21} plane, a {30-3-1} plane, a {30-32} plane, or an offcut from these planes within +/−5 degrees toward an a-plane or c-plane). The method includes forming a GaN region formed overlying the surface region, an active region formed overlying the surface region, and a gettering region comprising a magnesium species overlying the surface region. The method includes forming a p-type cladding region comprising an (InAl)GaN material doped with a plurality of magnesium species formed overlying the active region.

In an example, the semipolar plane is selected from one of a {30-3-1} plane, a {30-31} plane, a {20-2-1} plane, a {20-21} plane, a {30-3-1} plane, a {30-32} plane, or an offcut from these planes within +/−5 degrees toward an a-plane or c-plane. In an example, the device has an electron blocking region between the gettering region and the p-type cladding region.

In an alternative example, the device has a barrier region between the active region and the gettering region. The barrier region can comprise GaN or InGaN layers. In an example, the device has a GaN barrier region and wherein the p-type cladding region is a GaN p-cladding region substantially free from an aluminum bearing species.

In an example, the device has a separate confinement heterostructure region between the active region and the gettering region configured to confine an optical mode; the separate confinement heterostructure comprised of InGaN. The separate confinement heterostructure region comprises an InGaN layer in an example.

In an example, the p-type cladding region comprises a plurality of layers, the plurality of layers comprising GaN, AlGaN, and/or InAlGaN doped with various concentrations of magnesium, which can include various concentrations of magnesium in the plurality of layers ranges from $5E17$ cm$^{-3}$ to $3E19$ cm$^{-3}$. In an example, the p-type cladding region comprises a single layer or comprises multiple regions. In an example, at least a portion of the p-type cladding region is epitaxially grown at a temperature above about 900 C and the gettering region is provided at a temperature of less than about 900 degrees Celsius. In an example, at least a portion of the p-type cladding region is epitaxially grown at a temperature above about 900 C and the gettering region is provided at a temperature of less than about 850 degrees Celsius. In an example, at least a portion of the p-type cladding region is epitaxially grown at a temperature above about 950 C and the gettering region is provided at a temperature of less than about 850 degrees Celsius. In an example, at least a portion of the p-type cladding region is epitaxially grown at a temperature above 1000 C and the gettering region is provided at a temperature of less than about 850 degrees Celsius. In an example, the cladding region is formed at higher temperature than the gettering region. In an example, the p-type cladding region is a GaN p-cladding doped with a Mg concentration of less than $2E19$ cm$^{-3}$ or less than about $5E18$ cm$^{-3}$.

In an example, the gettering region comprising a magnesium species doped to increase incorporation of unintentionally incorporated magnesium from a first concentration to a second concentration. In an example, the gettering region comprises an intentionally doped region with Mg and an unintentional Mg doping region configured to incorporate any residual Mg before formation of the p-type region. In an example, the gettering region comprises a thickness of 2 nm to 50 nm and/or the gettering region comprises GaN, AlGaN, InAlGaN, or a combination thereof.

In an example, the electron blocking region comprises AlGaN or InAlGaN with an AlN mole fraction ranging from 5% to 35%. In an example, the electron blocking region comprises AlGaN or AlInGaN, and configured with a wider band gap than a barrier region configured within a vicinity of the electron blocking region. In an example, the electron blocking region is doped with a magnesium concentration between $5E18$ cm$^{-3}$ and $8E19$ cm$^{-3}$. In an example, each of the electron blocking region and the p-type cladding region are epitaxially grown at a temperature above about 900° C. In an example, the electron blocking region and at least a portion of the p-type cladding region are epitaxially grown at a temperature above about 900° C. and the gettering region is provided at a temperature of less than about 850 degrees Celsius. In an example, the electron blocking region is substantially free from magnesium doping. In an example, the electron blocking region is composed of at least one of GaN, InAlN or AlInGaN.

In an example, the active region comprises InGaN quantum wells configured to emit in the blue (430-48 nm) range or in the green (500 nm to 540 nm) range. In an example, the active region comprises a plurality of quantum well regions. In an example, the active region comprises one or more light emitting layers, each of the lighting emitting layers being configured between a pair of barrier regions, each of the lighting emitting layers having a thickness ranging from 2 to about 8 nm; and wherein each of the barrier regions has a thickness ranging from 2 to 20 nm or 2 to 4 nm or 4 to 20 nm.

Embodiments provided by the present disclosure achieve these benefits and others in the context of known process technology. However, a further understanding of the nature and advantages of the embodiments disclosed herein may be realized by reference to the specification and the attached drawings.

BRIEF DESCRIPTION OF THE DRAWINGS

FIG. 2B shows a similar test structure, where 10 nm of Mg-doped AlGaN is clad on either side (layers 1 and 2) by UID GaN. Layer 3 is a GaN layer doped with Mg at typical concentrations for reference. From FIG. 1 one can see that one will not be able to grow a stack of layers with arbitrary Mg concentration profile simply by modulating the Mg precursor flow.

DETAILED DESCRIPTION OF THE SPECIFIC EMBODIMENTS

Light emitting diodes and laser diodes are derived from semiconductor p-n junction diodes. These devices a comprised of various layers of semiconducting material doped with impurities such that one side of the device is "n-type" (i.e. electrons are the majority carrier species) and the other side is "p-type" (i.e. holes are the majority carrier species). In the III-V nitrides, p-type conductivity is predominantly achieved by doping the (In,Al)GaN layer with magnesium, which is a relatively deep acceptor in the III-nitrides. As opposed to a dopant species like Si, where the majority of the dopant atoms contribute electrons to conduction, the depth of the Mg acceptor state in the III-Nitride bandgap results in very few of the Mg atoms contributing to conduction. This combined with the volatility of Mg result in the need for the introduction of relatively large concentrations of Mg-bearing metal-organic precursors (typically $Cp_2Mg$) into the MOCVD chamber during growth of Mg-doped layers. This is unfortunate, as $Cp_2Mg$ is widely known to exhibit the so-called "memory" effect, whereby Mg metal-organic precursors remain in the chamber for some time after the intentional introduction of the precursor gas is stopped resulting in the unintentional incorporation of Mg into the subsequently grown layers. A second consequence of the high flows of Mg is the accumulation of unincorporated Mg on the growing surface of the epitaxial film. This excess of Mg will remain on the surface after the Mg precursor flow is halted resulting in the unintentional incorporation of Mg into the subsequently grown layers.

In laser diodes, this "memory effect" of residual Mg in the chamber and on the sample surface is particularly damaging to performance. Mg-doped GaN is highly absorbing, and absorption of light from the lasing optical mode is a significant source of loss in III-Nitride laser diodes. Ideally, one would design the Mg concentration profile such that layers such as the electron blocking layer (typically composed of AlGaN) are doped sufficiently with Mg to ensure that the position of the depletion region and injection efficiency of holes and electrons is optimal, but at the same time reduce to a minimum the amount of Mg in layers that do not significantly influence injection efficiency but which do interact with the optical mode. The Mg memory effect can potentially set a lower limit for how low the Mg concentration can be in a given layer based on the dose of Mg precursor introduced into the chamber in previous layers.

Figure 1:
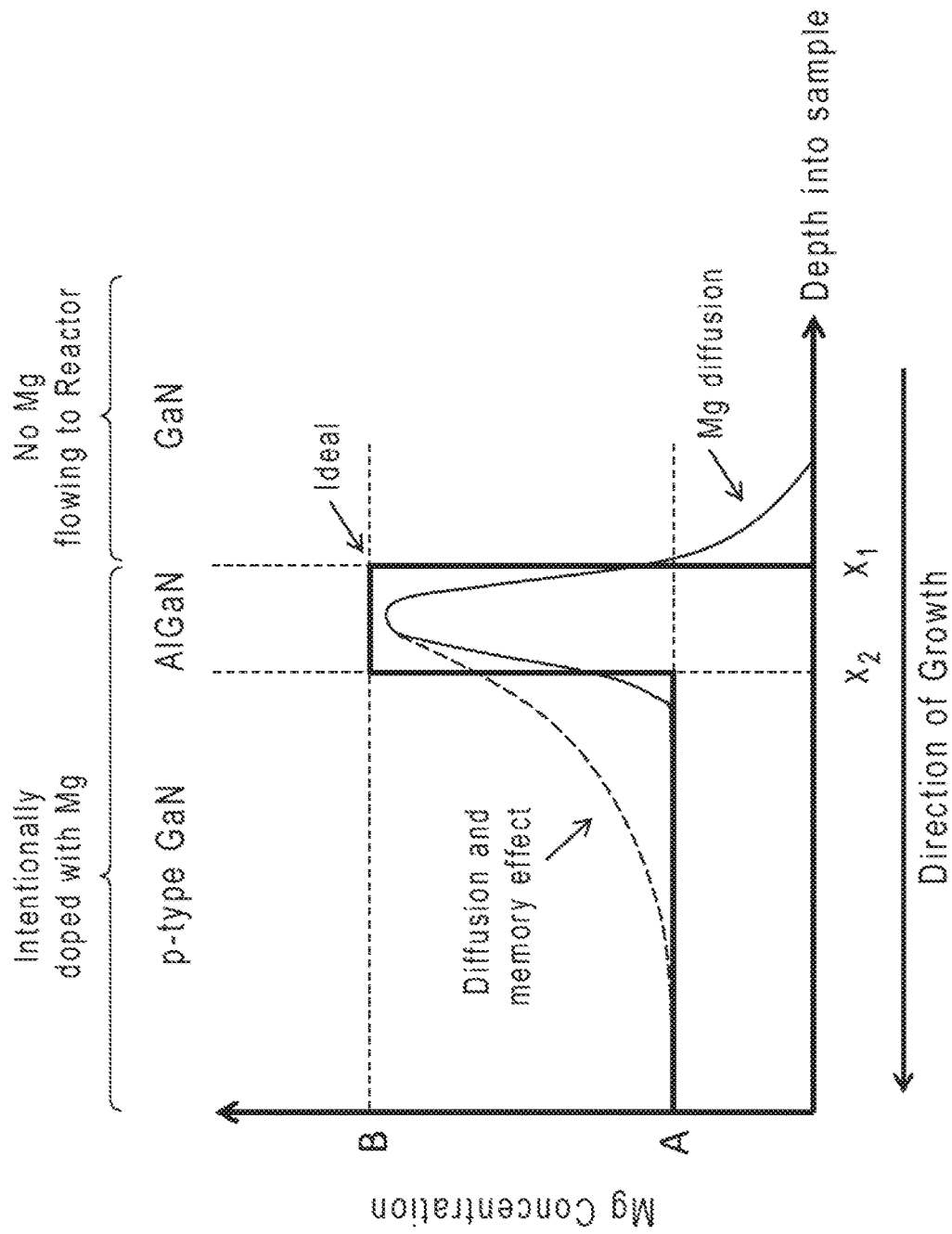
FIG. 1 shows a schematic representation of ideal Mg concentration profile near an AlGaN electron blocking layer and the impact of Mg diffusion and the Mg-Memory effect on how Mg concentration profiles differ in practice from the ideal. In the ideal case (dashed horizontal line) steps in Mg concentration are sharply defined. In the case with significant Mg diffusion (solid line) the peak Mg concentration in the EBL is reduced and the steps in the Mg profile become graded as Mg diffuses from the EBL into the surrounding, lower-Mg-concentration material. In the case with Mg memory-effect (dashed line) the high concentration of Mg precursor ($Cp_2Mg$) used in the growth of the higher Mg-concentration EBL results in residual Mg in the MOCVD chamber that acts as an unwanted source of Mg. The unintentionally incorporated Mg results in a tail of Mg extending up into layers grown immediately after the EBL at concentrations larger than those expected from Mg-diffusion alone. As time passes, and more material is grown, the source of unintentional Mg is depleted until the background Mg concentrations are once again below the intentional Mg concentration.
Figure 2A:
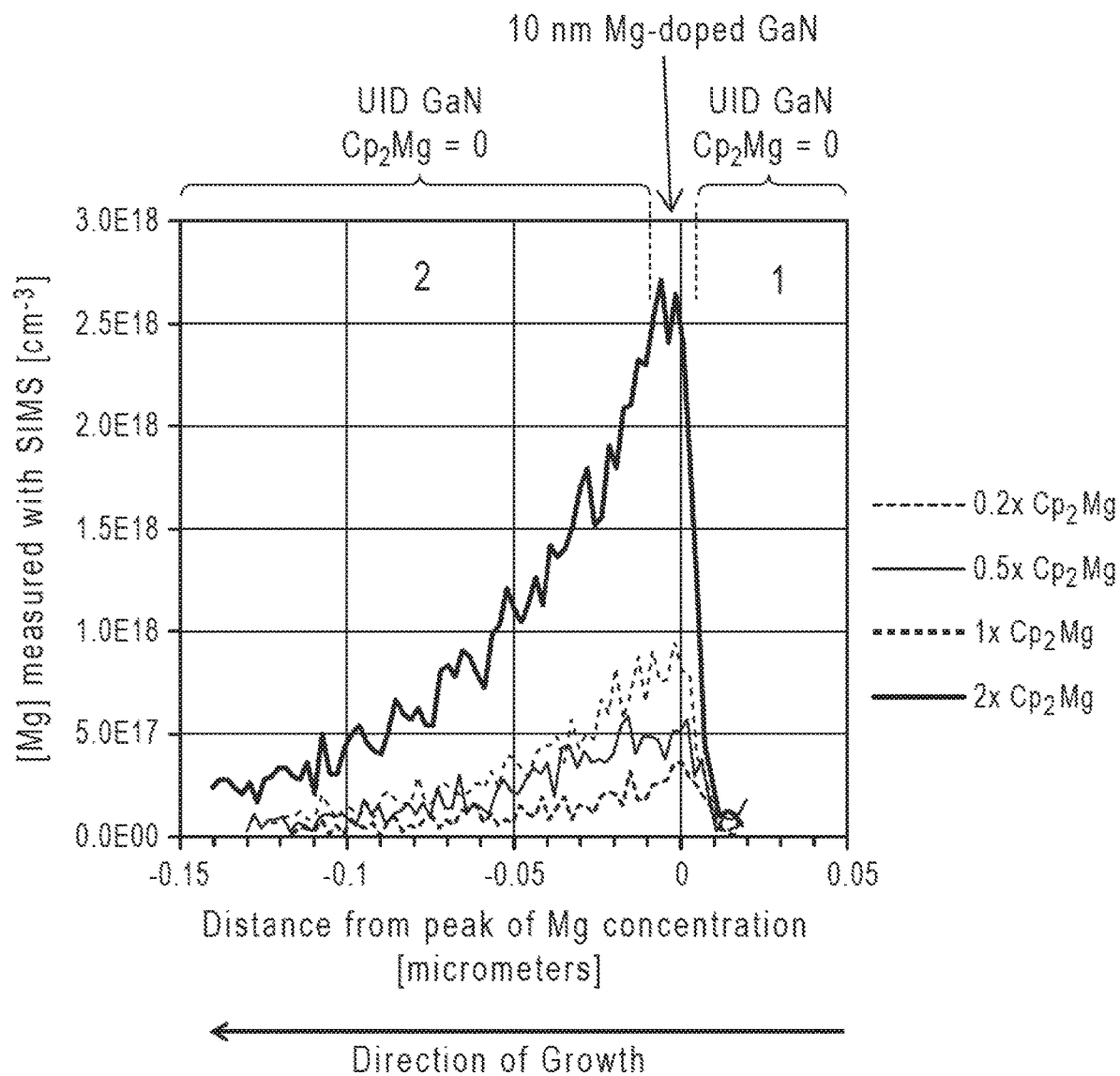
FIGS. 2A and 2B show Secondary Ion Mass Spectrometry (SIMS) profiles of Mg concentration in GaN layers grown on a (30-3-1) substrate under typical p-type GaN growth conditions. These test structures consisted of two unintentionally doped (UID) GaN layers (layers 1 and 2) on either side of a 10 nm thick Mg-doped GaN layer; Mg precursor flow in the UID GaN layers was zero. Mg flow in the doped GaN film was varied over an order of magnitude, and it can be seen in FIG. 2A that at each doping level a long tail of Mg is observed extending greater than 100 nm into the otherwise un-doped layer 2.
Figure 2B:
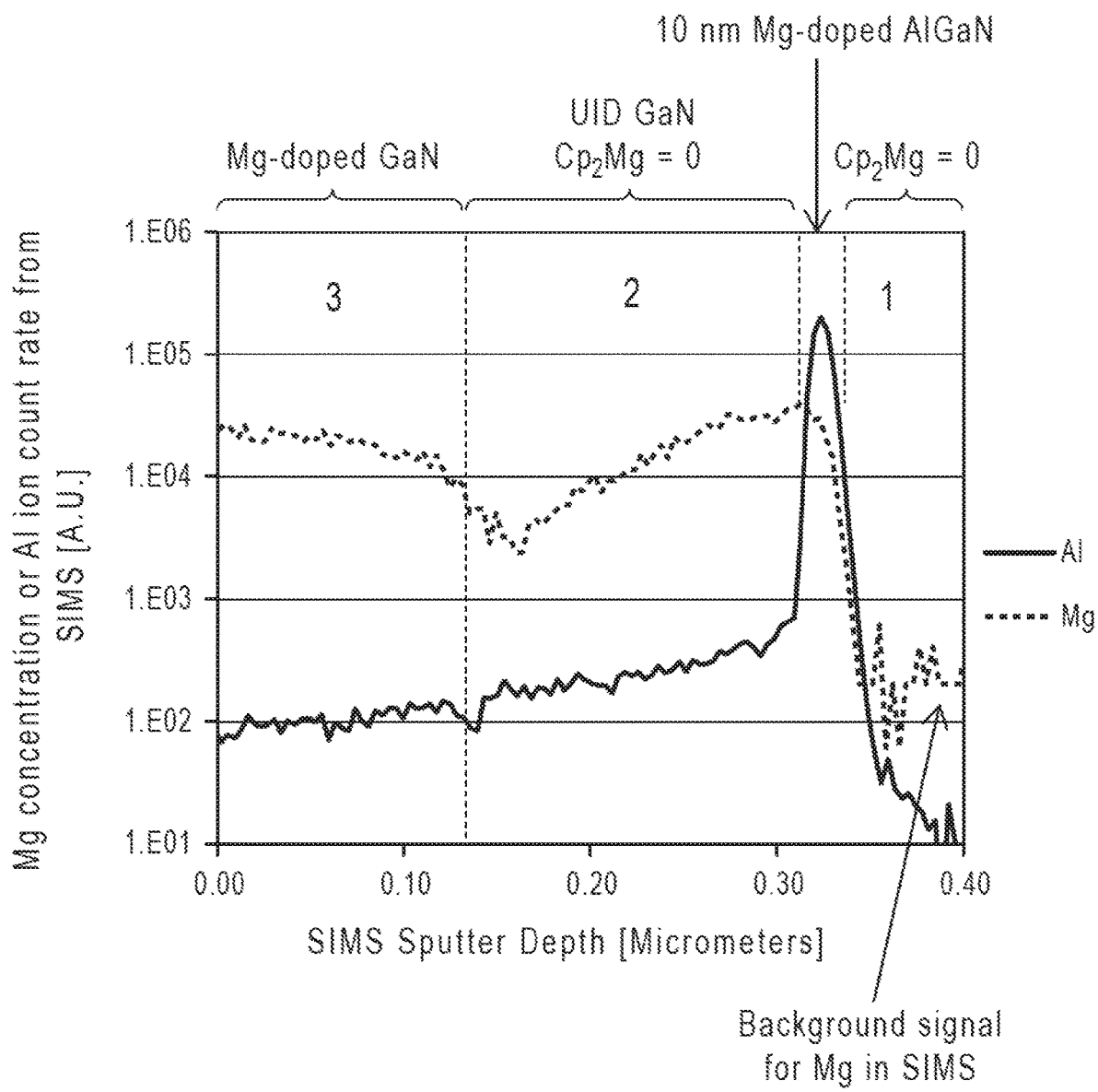

FIG. 1 shows a schematic representation of the expected Mg concentration profile near an AlGaN EBL for the ideal case as well as for cases where the Mg memory-effect and Mg diffusion at growth temperature are non-negligible. Mg memory-effect results in an asymmetrical 'tail' of Mg extending away from the EBL-where Mg precursor flows are typically highest-into the subsequently grown layers. An example of this type of Mg concentration profile can be observed in FIG. 2A, which shows Secondary Ion Mass Spectrometry (SIMS) profiles of Mg concentration in GaN layers grown under typical p-type GaN growth conditions. These test structures consisted of two unintentionally doped (UID) GaN layers (layers 1 and 2) on either side of a 10 nm thick Mg-doped GaN layer; Mg precursor flow in the UID GaN layers was zero. Mg flow in the doped GaN film was varied over an order of magnitude, and it can be seen that at each $Cp_2Mg$ doping level a long tail of Mg is observed extending greater than 100 nm into the otherwise un-doped layer 2. FIG. 2B shows a similar test structure, where 10 nm of Mg-doped AlGaN is clad on either side (layers 1 and 2) by UID GaN. Layer 3 is a GaN layer doped with Mg at typical concentrations for reference. From FIG. 1 one can see that one will not be able to grow a stack of layers with arbitrary Mg concentration profile simply by modulating the Mg precursor flow.

Figure 3A:
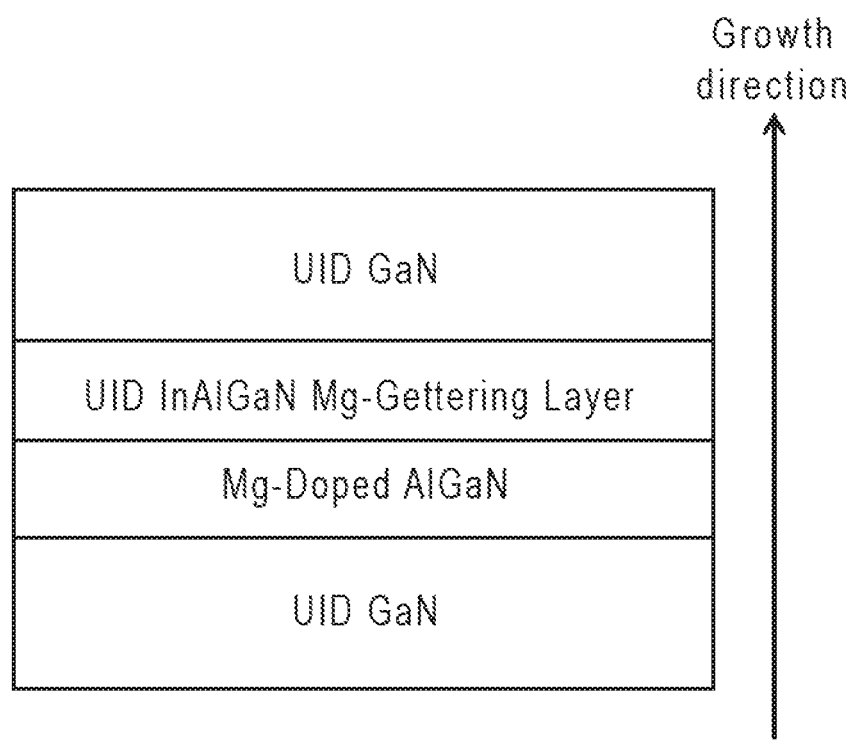
FIG. 3A shows a schematic of a test structure grown on a (10-10) substrate similar to those in FIG. 2B, which consist of UID GaN cladding surrounding a Mg-doped AlGaN layer. Immediately following the growth of the Mg-doped AlGaN a thin (<10 nm) UID InAlGaN layer was grown. The baseline sample has no InAlGaN Mg-gettering layer.
Figure 3B:
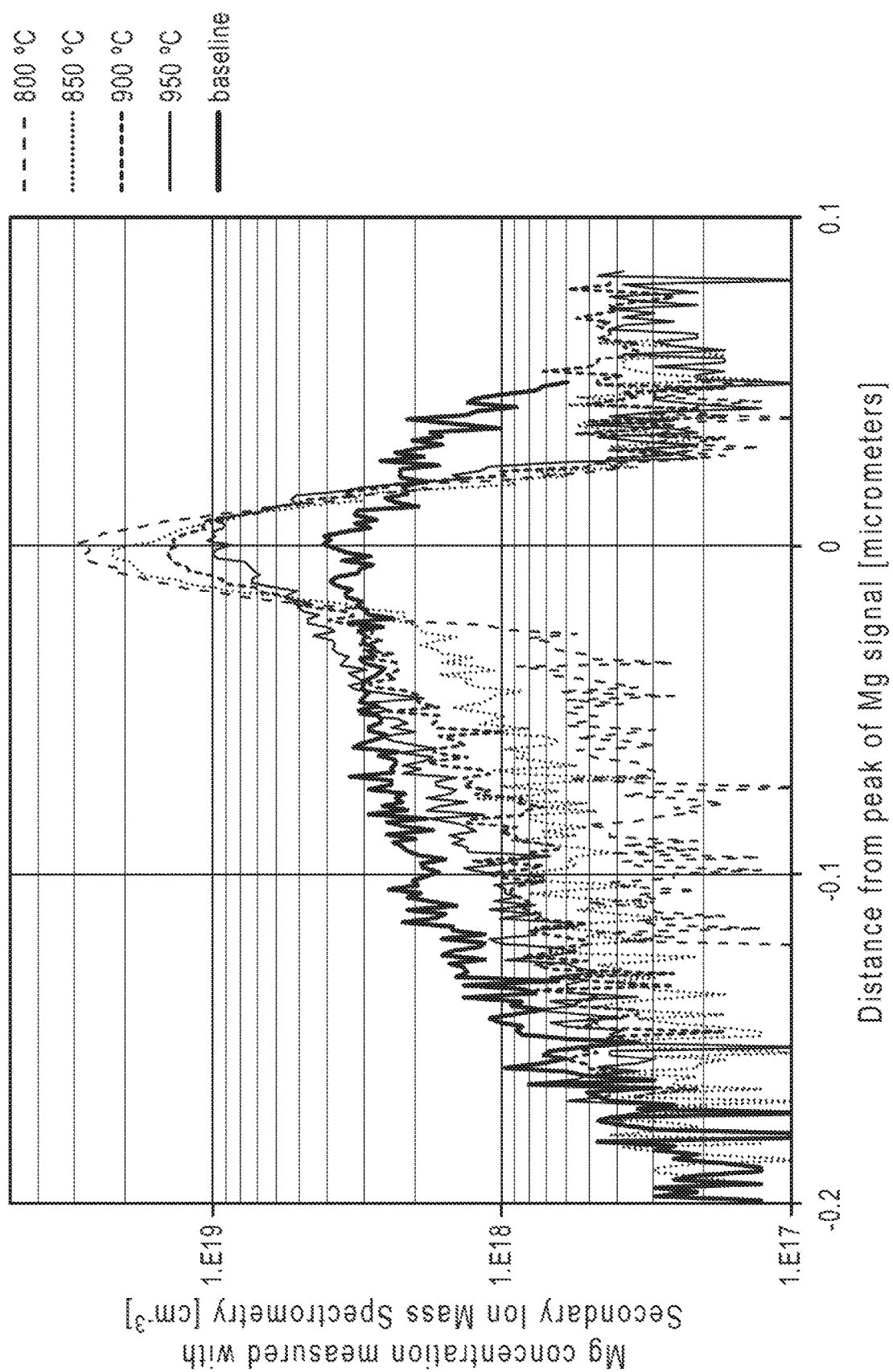
FIG. 3B shows SIM profiles of the structure illustrated in FIG. 3A.

It is, however, possible to change the rate of Mg incorporation by adjusting layer composition and growth conditions such that the rate of Mg incorporation is increased, thereby incorporating the residual Mg into a thinner layer resulting in a higher peak concentration. FIG. 3A shows a set of test structures similar to those in FIGS. 2A and 2B. The test structures shown in FIG. 3A consist of UID GaN cladding surrounding a Mg-doped AlGaN layer. Immediately following the growth of the Mg-doped AlGaN a thin (<10 nm) UID InAlGaN layer was grown at different temperatures from 800° C. to 950° C. As shown in FIG. 3B it can be seen that this layer results in two changes to the Mg-profile. The first is that this layer getters Mg from the MOCVD chamber and the sample surface, leading to a significantly higher peak Mg concentration. Secondly, this preferential incorporation of Mg results in a sharper decrease in the Mg concentration in the subsequently grown UID GaN layer. Due to the relatively poor depth resolution of SIMS and transients in Mg incorporation the Mg concentrations in the EBL and gettering layer are convolved into a single peak.

Figure 4A:
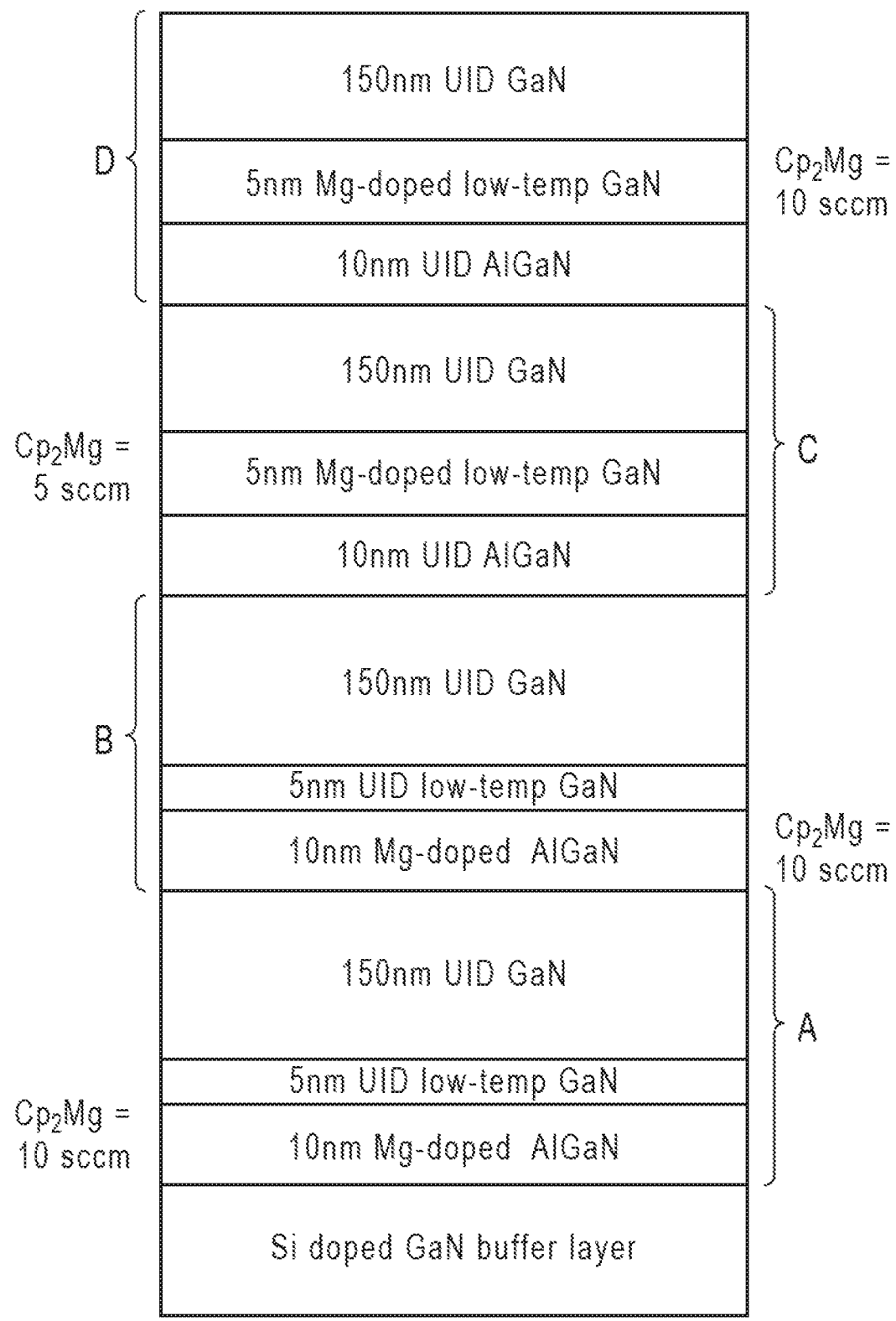
FIG. 4A shows a (30-3-1) oriented four-layer test structure comprised of AlGaN layers separated by UID GaN grown under typical p-GaN conditions. Between the UID p-GaN and the AlGaN are thin layers of GaN grown at lower temperatures than one would typically grow high quality Mg-doped GaN.
Figure 4B:
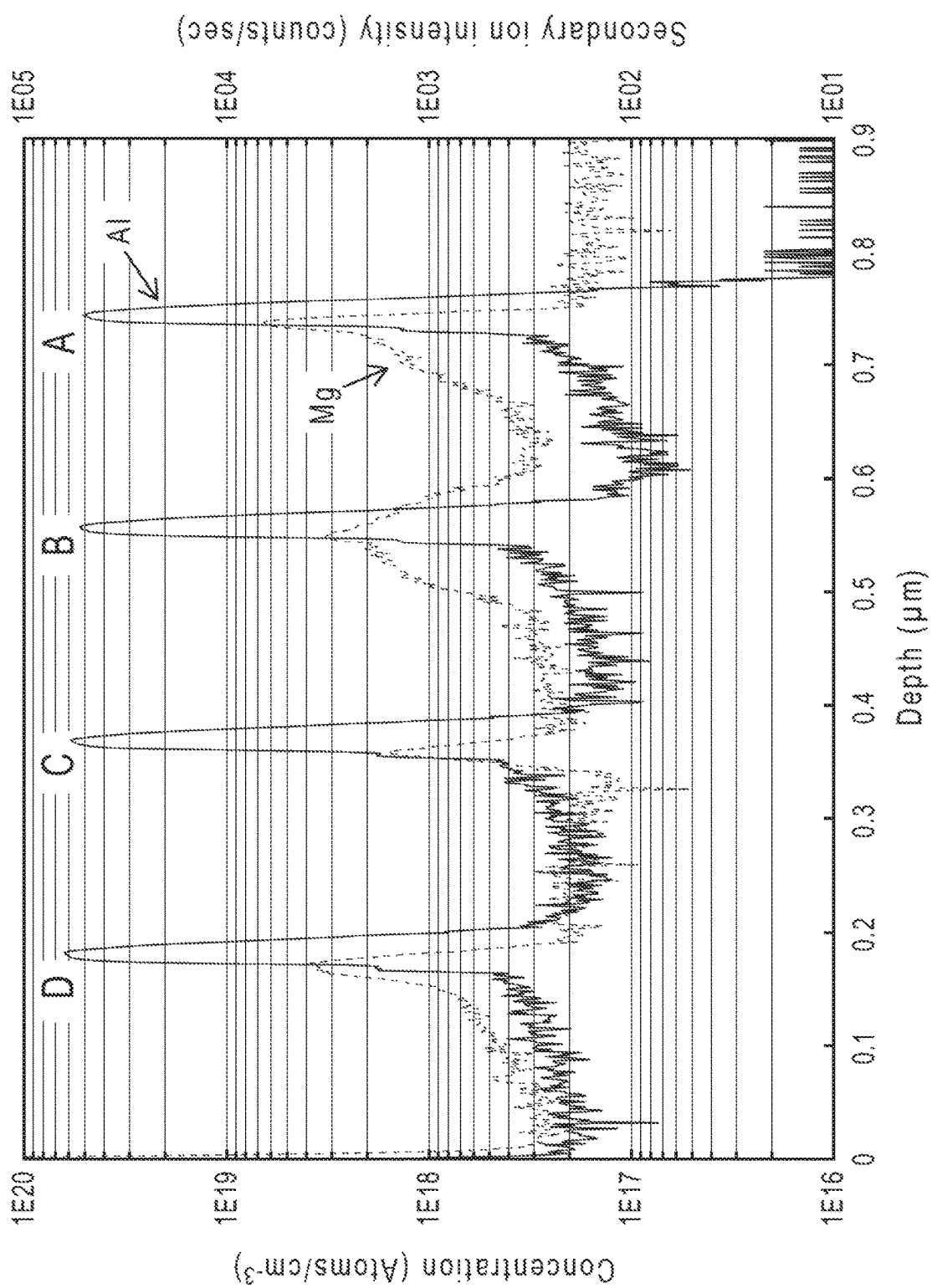
FIG. 4B shows SIM profiles of the structure illustrated in FIG. 4A.

In order to obtain arbitrary doping profiles, Mg can be added to the getter layer directly. FIG. 4B shows SIMS concentration profiles for a four-layer test structure as shown in FIG. 4A consisting of AlGaN layers separated by UID GaN grown under typical p-GaN conditions. Between the UID p-GaN and the AlGaN are thin layers of GaN grown at lower temperatures than one would typically grow high quality Mg-doped GaN. The layer sets marked 'A' and 'B' contain AlGaN doped with a low flow of Mg, and the low temperature GaN layers were grown with different transitions between the AlGaN and LT GaN layers. Here the low-temperature GaN layers result in a spike in the Mg-concentration measured by SIMS, but are not able to incorporate all of the residual Mg resulting in significant Mg concentrations in the subsequently grown UID GaN. Layers 'C' and 'D' contain UID AlGaN, and the low-temperature GaN layers are doped with a small flow of Mg. This results in peak Mg concentrations similar to those in 'A' and 'B' while retaining the sharp turn-on and turn-off of the Mg concentration profile.

This Mg memory effect has been observed in GaN films of various orientations including non-polar, semi-polar and c-plane. We have observed the effectiveness of getter layers in both m-plane as well as (30-3-1) oriented films.

An AlInGaN laser diode with non-polar ({10-10}) or semi-polar ({10-10} offcut at large angles toward or away from the [0001] direction such as a {40-4-1} plane, a {40-41}, a {30-3-1} plane, a {30-31} plane, a {20-2-1} plane, a {20-21} plane, a {30-3-1} plane, a {30-32} plane, or an offcut from these planes within +/−5 degrees toward an a-plane or c-plane.) crystal orientation where there is an epitaxial layer grown between any of the various Mg-doped layers where (A) the growth conditions or composition of the layer are different from adjacent layers and (B) the layer composition and/or growth conditions are chosen to preferentially incorporate (i.e. getter) residual Mg resulting from previous Mg-doped layer growth that otherwise would be incorporated in subsequently grown layers. This invention is associated in particular with getter layers dispositioned between highly Mg-doped layers grown near the light emitting layer(s) and subsequently grown layers comprising the p-cladding.

Figure 5:
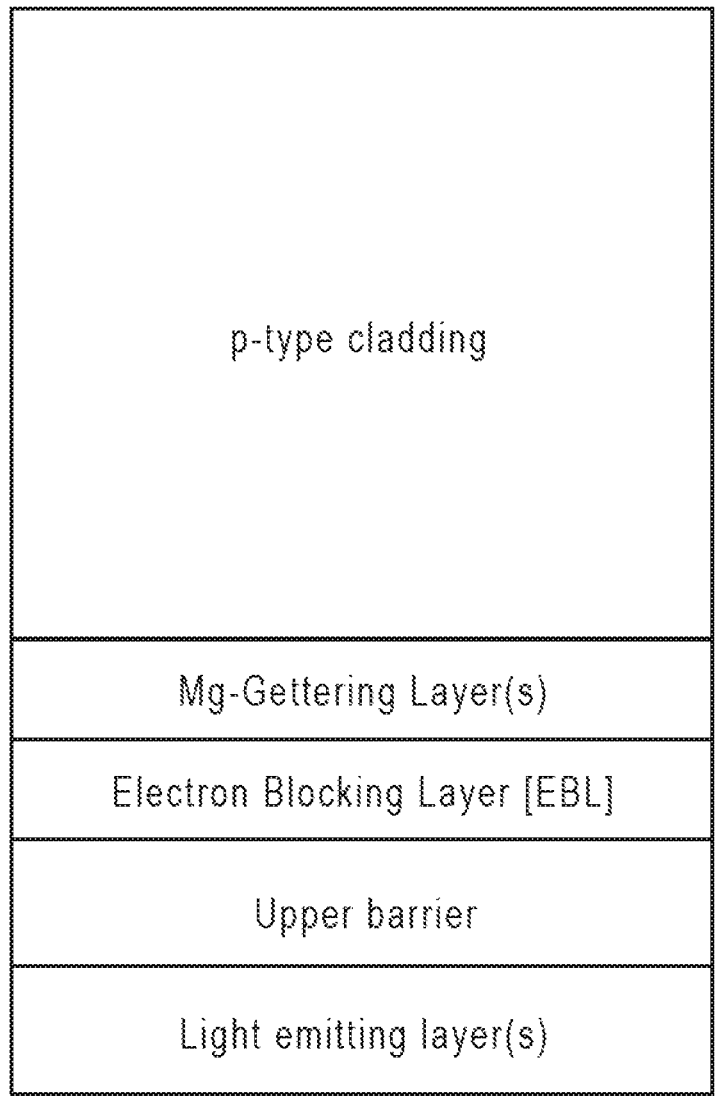
FIG. 5 shows a schematic and definitions used for example embodiments.

Certain embodiments of the present disclosure are provided in the following. FIG. 5 shows the structure of the devices covered in these example embodiments and description of individual layers.

Embodiment 1: a non-polar or semi-polar, blue or green LD consisting of one or more light emitting layers with an AlGaN EBL, a GaN upper barrier and GaN p-cladding. The EBL is doped uniformly with a Mg concentration between $5E18$ $cm^{-3}$ and $5E19$ $cm^{-3}$. The GaN p-cladding is doped uniformly with a Mg concentration of less than $2E18$ $cm^{-3}$. The EBL and pGaN are both grown at a temperature above 900° C. After EBL growth is complete, flow of the Mg precursor to the reactor growth chamber is interrupted and the substrate temperature is decreased to 800 degrees Celsius and 10 nm of nominally undoped GaN is grown in order to getter residual Mg. The substrate temperature is then increased to the p-cladding growth temperature while conditions are ramped to the p-cladding growth conditions. Once the reactor conditions are stable the Mg precursor is reintroduced to the reactor and growth of the Mg-doped p-cladding layers is commenced.

Embodiment 2: A device similar to that of embodiment 1 where the Mg getter layer is grown with a small flow of Mg precursor into the growth chamber. Mg flow during the getter layer growth is chosen such that the peak Mg concentration in the getter layer is higher than what would be achieved using a not-intentionally doped getter layer while keeping the Mg flow low enough that there is not a net increase in residual Mg.

Embodiment 3: a device similar to that of embodiment 1 where the EBL is grown without Mg doping and the getter layer is intentionally doped with Mg to a concentration high enough to ensure good electrical performance of the device.

Embodiment 4: a device similar to that of embodiments 2 or 3 where the gettering layer consists of two parts. The first part is grown intentionally doped with Mg (to produce an adequate peak Mg concentration) and the second part is grown without intentional Mg doping (to quickly incorporate any residual Mg before the p-cladding is grown).

Embodiment 4b: a device similar to that of 2 or 3 where the gettering layer consists of a multiplicity of intentionally doped and non-intentionally doped layers.

Embodiment 5: a device similar to that of embodiments 2, 3, 4 or 4b where the EBL is composed of some composition of GaN, InAlN or AlInGaN.

Embodiment 6: a device similar to that of 2, 3, 4, 4b and 5 where the getter layer has a composition similar to that of the EBL.

Embodiment 7: a device similar to that of 3, 4 or 4b where the EBL is removed from the structure and the getter layer contains at least one layer that is intentionally doped. The getter layer can be any composition of AlInGaN.

Embodiment 8: a device similar to those of 1, 2, 3, 4, 4b, 5, 6 or 7 where the p-cladding consists of one or more low index layers such as AlGaN or AlInGaN.

Embodiment 9: a device similar to 1-8 which contains an InGaN layer between the getter layer and the p-cladding to help shape the optical mode.

In an example, the present invention provides the following method, as outlined in the following.

Provide a gallium and nitrogen containing substrate material comprising a surface region, which is configured on either a non-polar ({10-10}) crystal orientation or a semi-polar ({10-10} crystal orientation configured with an offcut at an angle toward or away from the [0001] direction such as {40-4-1}, {40-41}, {30-3-1}, {30-31}, {20-2-1}, {20-21}, {30-3-1}, {30-32}, or an offcut from these planes within +/−5 degrees toward an a-plane or c-plane);

Form a GaN region formed overlying the surface region;

Form an active region formed overlying the surface region;

Form a gettering region comprising a magnesium species overlying the surface region;

Form a p-type cladding region comprising an (InAl)GaN material doped with a plurality of magnesium species formed overlying the active region; and Perform other steps, as desired.

Further details of the present method can include certain process recipes as described in more detail below.

In an example, the optical device includes a gallium nitride substrate member having a semipolar crystalline surface region characterized by an orientation of about 9 degrees to about 12.5 degrees toward (000-1) from the m-plane.). In a specific embodiment, the gallium nitride substrate member is a bulk GaN substrate characterized by having a semipolar crystalline surface region, but can be others. In a specific embodiment, the bulk GaN substrate has a surface dislocation density below $10^5$ $cm^{-2}$ or $10^5$ to $10^7$ $cm^{-2}$. It should be noted that homoepitaxial growth on bulk GaN is generally better than hetero-epitaxy growth. The nitride crystal or wafer may comprise $Al_xIn_yGa_{1-x-y}N$, where $0 \leq x$, $y$, $x+y \leq 1$. In one specific embodiment, the nitride crystal comprises GaN. In one or more embodiments, the GaN substrate has threading dislocations, at a concentration between about $10^5$ $cm^{-2}$ and about $10^8$ $cm^{-2}$, in a direction that is substantially orthogonal or oblique with respect to the surface. As a consequence of the orthogonal or oblique orientation of the dislocations, the surface dislocation density is below about $10^5$ $cm^{-2}$ or others such as those ranging from about $10^5$ $cm^{-2}$ to $10^8$ $cm^{-2}$.

In a specific embodiment, the device has a laser stripe region formed overlying a portion of the semipolar crystalline orientation surface region. In a specific embodiment, the laser stripe region is characterized by a cavity orientation is substantially parallel to the projection of the c-direction. In a specific embodiment, the laser stripe region has a first end and a second end. In a preferred embodiment, the device has a first facet provided on the first end of the laser stripe region and a second facet provided on the second end of the laser stripe region. In one or more embodiments, the first facet is substantially parallel with the second facet. Mirror surfaces are formed on each of the surfaces. The first facet comprises a first mirror surface. In a preferred embodiment, the first mirror surface is provided by an etching process. The etching process can use any suitable techniques, such as a chemical etching process using a CAME etching processor combinations. In a specific embodiment, the first mirror surface comprises a reflective coating. In a specific embodiment, deposition of the reflective coating occurs using, for example, e-beam evaporation, thermal evaporation, RF sputtering, DC sputtering, ECR sputtering, ion beam deposition, Ion Assisted Deposition, reactive ion plating, any combinations, and the like. In still other embodiments, the present method may provide surface passivation to the exposed surface prior to coating. The reflective coating is selected from silicon dioxide, hafnia, and titania, tantalum pentoxide, zirconia, including combinations, and the like. Preferably, the reflective coating is highly reflective and includes a coating of silicon dioxide and tantalum pentoxide, which has been deposited using electron beam deposition. Depending upon the embodiment, the first mirror surface can also comprise an anti-reflective coating. Additionally, the facets can be etched or a combination of them.

Also in a preferred embodiment, the second facet comprises a second mirror surface. The second mirror surface is provided by an etching techniques using etching technologies such as reactive ion etching (ME), inductively coupled plasma etching (ICP), or chemical assisted ion beam etching (CAIBE), or other method. In an example, (CAIBE), (ICP), or (ME) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and 93 degrees or between about 89 and 91 degrees from the surface plane of the wafer. The etched facet surface region must be very smooth with root mean square roughness values of less than 50 nm, 20 nm, 5 nm, or 1 nm. Lastly, the etched should be substantially free from damage, which could act as non-radiative recombination centers and hence reduce the COMD threshold. In an example, CAIBE is provides very smooth and low damage sidewalls due to the chemical nature of the etch, while it can provide highly vertical etches due to the ability to tilt the wafer stage to compensate for any angle in etch in an example.

In a specific embodiment, the second mirror surface comprises a reflective coating, such as silicon dioxide, hafnia, titania, tantalum pentoxide, zirconia, combinations, and the like. In a specific embodiment, the second mirror surface comprises an anti-reflective coating, such alumina or aluminum oxide. In a specific embodiment, the coating can be formed using electron beam deposition, thermal evaporation, RF sputtering, DC sputtering, ECR sputtering, ion beam deposition, ion assisted deposition, reactive ion plating, any combinations, and the like. In still other embodiments, the present method may provide surface passivation to the exposed surface prior to coating.

In a specific embodiment, the laser stripe has a length and width. The length ranges from about 200 microns to about 3000 microns. The stripe also has a width ranging from about 0.5 microns to about 50 microns, but can be other dimensions. In a specific embodiment, the stripe can also be about 6 to 25 microns wide for a high power multi-lateral-mode device or 1 to 2 microns for a single lateral mode laser device. In a specific embodiment, the width is substantially constant in dimension, although there may be slight variations. The width and length are often formed using a masking and etching process, which are commonly used in the art. Further details of the present device can be found throughout the present specification and more particularly below.

In a specific embodiment, the device is also characterized by a spontaneously emitted light that is polarized in substantially perpendicular to the projection of the c-direction (in the a-direction). That is, the device performs as a laser or the like. In a preferred embodiment, the spontaneously emitted light is characterized by a polarization ratio of greater than 0.2 to about 1 perpendicular to the c-direction. In a preferred embodiment, the spontaneously emitted light characterized by a wavelength ranging from about 400 nanometers to yield a violet emission, a blue emission, a green emission, and others. In one or more embodiments, the light can be emissions ranging from violet 395 to 420 nanometers; blue 430 to 470 nm; green 500 to 540 nm; and others, which may slightly vary depending upon the application. In a preferred embodiment, the spontaneously emitted light is highly polarized and is characterized by a polarization ratio of greater than 0.4. In a specific embodiment, the emitted light is characterized by a polarization ratio that is desirable. Further details of the laser device can be found throughout the present specification and more particularly below.

In an example, a waveguide design has a nonpolar or a semipolar laser diode that contains cladding regions that are substantially free from aluminum. Such laser diode designs can enable high COMD levels without the need for highly-specialized and costly mirror coating techniques such as electron cyclotron resonance (ECR). As shown in an example, the laser device includes gallium nitride substrate, which has an underlying n-type metal back contact region. In a specific embodiment, the metal back contact region is made of a suitable material such as those noted below and others. Further details of the contact region can be found throughout the present specification and more particularly below.

In a specific embodiment, the device also has an overlying n-type gallium nitride layer, an active region, and an overlying p-type gallium nitride layer structured as a laser stripe region. Additionally, the device also includes an n-side separate confinement heterostructure (SCH), p-side guiding layer or SCH, p-AlGaN EBL, among other features. In a specific embodiment, the device also has a p++ type gallium nitride material to form a contact region. In a specific embodiment, the p++ type contact region has a suitable thickness and may range from about 10 nm 50 nm, or other thicknesses. In a specific embodiment, the doping level can be higher than the p-type cladding region and/or bulk region. In a specific embodiment, the p++ type region has doping concentration ranging from about 10E19 to 10E21 Mg/centimeter$^3$, and others. The p++ type region preferably causes tunneling between the semiconductor region and overlying metal contact region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where 0≤u, v, u+v≤1, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 900 to about 1200 degrees Celsius in the presence of a nitrogen-containing gas. As an example, the carrier can be hydrogen or nitrogen or others. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (e.g., ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm is initiated.

In a specific embodiment, the laser stripe region is made of the p-type gallium nitride layer. In a specific embodiment, the laser stripe is provided by an etching process selected from dry etching or wet etching. In a preferred embodiment, the etching process is dry, but can be others. As an example, the dry etching process is an inductively coupled plasma process using chlorine bearing species or a reactive ion etching process using similar chemistries or combination of ICP and RIE, among other techniques. Again as an example, the chlorine bearing species are commonly derived from chlorine gas or the like. The device also has an overlying dielectric region, which exposes contact region, which is preferably a p++ gallium nitride region. In a specific embodiment, the dielectric region is an oxide such as silicon dioxide or silicon nitride, but can be others, such as those described in more detail throughout the present specification and more particularly below. The contact region is coupled to an overlying metal layer. The overlying metal layer is a multilayered structure containing gold and platinum (Ni/Au), but can be others such as gold and palladium (Pd/Au) or gold and nickel (Ni/Au). In an alternative embodiment, the metal layer comprises Ni/Au formed using suitable techniques. In a specific embodiment, the Ni/Au is formed via electron-beam deposition, sputtering, or any like techniques. The thickness includes nickel material ranging in thickness from about 50 to about 100 nm and gold material ranging in thickness from about 100 Angstroms to about 1-3 microns, and others.

In a preferred embodiment, the dielectric region can be made using a suitable technique. As an example, the technique may include reactively sputter of $SiO_2$ using an undoped polysilicon target (99.999% purity) with $O_2$ and Ar. In a specific embodiment, the technique uses RF magnetron sputter cathodes configured for static deposition; sputter target; throw distance; pressure: 1-5 mT or about 2.5 mT, power: 300 to 400 W; flows: 2-3.-9 sccm $O_2$, 20-50 sccm, Ar, deposition thickness: 1000-2500 A, and may include other variations. In a specific embodiment, deposition may occur using non-absorbing, nonconductive films, e.g., $Al_2O_3$, $Ta_2O_5$, $SiO_2$, $Ta_2O_5$, $ZrO_2$, $TiO_2$, $HfO_2$, $NbO_2$. Depending upon the embodiment, the dielectric region may be thinner, thicker, or the like. In other embodiments, the dielectric region can also include multilayer coatings, e.g., 1000 Å of $SiO_2$ capped with 500 Å of $Al_2O_3$. Deposition techniques can include, among others, ebeam evaporation, thermal evaporation, RF Sputter, DC Sputter, ECR Sputter, Ion Beam Deposition, Ion Assisted Deposition, reactive ion plating, combinations, and the like.

In a specific embodiment, the laser device has active region. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1 to 20 quantum wells. Preferably, the active layer may include about 3-7 quantum wells or more preferably 4-6 quantum wells or others. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 30 nm. In a preferred embodiment, each of the thicknesses is preferably 3-8 nm. In a specific embodiment, each well region may have a thickness of about 5 nm to 7 nm and each barrier region may have a thickness of about 2 nm to about 5 nm, among others. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In a specific embodiment, the separate confinement heterostructure (SCH) can include AlInGaN or preferably InGaN, but can be other materials. The SCH is generally comprised of material with an intermediate index between the cladding layers and the active layers to improve confinement of the optical mode within the active region of the laser device according to a specific embodiment. In one or more embodiments, the SCH layers have a desirable thickness, impurity, and configuration above and below the active region to confine the optical mode. Depending upon the embodiment, the upper and lower SCH can be configured differently or the same. The electron blocking region can be on either side or both sides of the SCH positioned above the active region according to a specific embodiment. In a preferred embodiment, the SCH can range from about 100 nm to about 1500 nm, and preferably about 40 nm to 100 nm for the lower SCH region. In the upper SCH region, the thickness ranges from about 20 nm to 50 nm in a specific embodiment. As noted, the SCH is preferably InGaN having about 2% to about 5% indium or 5% to about 10% by atomic percent according to a specific embodiment.

In some embodiments, an electron blocking layer is preferably deposited. In a specific embodiment, the electron blocking layer comprises a gallium and nitrogen containing material including magnesium 10E16 cm$^{-3}$ to about 10E22 cm$^{-3}$. The electron-blocking layer may comprise $Al_sIn_tGa_{1-s-t}N$, where $0 \leq s$, t, $s+t \leq 1$, with a higher bandgap than the active layer, and may be doped p-type. In one specific embodiment, the electron blocking layer comprises AlGaN with an Al composition ranging from 5 to 20%. In another embodiment, the electron blocking layer may not contain Al. In another embodiment, the electron blocking layer comprises an AlGaN/GaN super-lattice structure, comprising alternating layers of AlGaN and GaN, each with a thickness between about 0.2 nm and about 5 nm.

As noted, the p-type gallium nitride structure, which can be a p-type doped $Al_qIn_rGa_{1-q-r}N$, where $0 \leq q$, r, $q+r \leq 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1 nm to 50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes contact region. In a specific embodiment, the dielectric region is an oxide such as silicon dioxide, but can be others.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

In a specific embodiment, a ridge waveguide is fabricated using a certain deposition, masking, and etching processes. In a specific embodiment, the mask is comprised of photoresist (PR) or dielectric or any combination of both and/or different types of them. The ridge mask is 1 to 2.5 microns wide for single lateral mode applications or 2.5 to 30 um wide for multimode applications. The ridge waveguide is etched by ion-coupled plasma (ICP), reactive ion etching (ME), chemical assisted ion beam (CAIBE) etched, or other method. The etched surface is 20-250 nm above the active region. A dielectric passivation layer is then blanket deposited by any number of commonly used methods in the art, such as sputter, e-beam, PECVD, or other methods. This passivation layer can include SiO2, Si3N4, Ta2O5, or others. The thickness of this layer is 80-400 nm thick. An ultrasonic process is used to remove the etch mask which is covered with the dielectric. This exposes the p-GaN contact layer. P-contact metal is deposited by e-beam, sputter, or other deposition technique using a PR mask to define the 2D geometry. The contact layer can be Ni/Au but others can be Pt/Au or Pd/Au. Further details of the present method and resulting structure can be found throughout the present specification and more particularly below. Further details of the facets can be found throughout the present specification and more particularly below.

In one or more preferred embodiments, the present invention provides a laser structure without an aluminum bearing cladding region. In a specific embodiment, the laser device comprises a multi-quantum well active region having thin barrier layers. In one or more embodiments, the active region comprises three or more quantum well structures. Between each of the quantum well structures comprises a thin barrier layer, e.g., 7 nm and less, 6 nm and less, 5 nm and less, 4 nm and less, 3 nm and less, 2 nm and less. In a preferred embodiment, the combination of thin barrier layers configured in the multi-quantum well structures enables a low voltage (e.g., 6 volts and less) laser diode free from use of aluminum bearing cladding regions.

In a specific embodiment, the present invention provides an optical device. The optical device has a gallium and nitrogen containing substrate including a (30-3-1) or offcut crystalline surface region orientation, which may be off-cut. The device preferably has an n-type cladding material overlying the n-type gallium and nitrogen containing material according to a specific embodiment. The n-type cladding material is substantially free from an aluminum bearing material according to a specific embodiment. The device also has an active region comprising at least three quantum wells. Each of the quantum wells has a thickness of 3.0 nm and greater or 5.5 nm and greater, and one or more barrier layers. Each of the barrier layers has a thickness ranging from about 2 nm to about 5 nm or about 5 nm to about 9 nm and is configured between a pair of quantum wells according to a specific embodiment. At least one or each of the barrier layers has a thickness ranging from about 2 nm to about nm and is configured between a pair of quantum wells or adjacent to a quantum well according to a specific embodiment. At least one or each of the barrier layers has a thickness ranging from about 4 nm to about 6.5 nm and is configured between a pair of quantum wells or adjacent to a quantum well according to a specific embodiment. Preferably, the device has a p-type cladding material overlying the active region. Preferably, the p-type cladding material is substantially free from an aluminum bearing material according to a specific embodiment. In a preferred embodiment, the active region is configured operably for a forward voltage of less than about 6V or less than about 5V for the device for an output power of 60 mW or 100 mW and greater.

In yet an alternative embodiment, the present invention provides an optical device. The device has a gallium and nitrogen containing substrate including a (30-3-1) or offcut crystalline surface region orientation. The device also has an n-type cladding material overlying the n-type gallium and nitrogen containing material. The n-type cladding material is substantially free from an aluminum bearing material. The device further has an active region comprising at least three quantum wells. Each of the quantum wells has a thickness of 3.5 nm and greater or 5 nm and greater and one or more barrier layers according to a specific embodiment. Each of the barrier layers has a thickness ranging from about 2 nm to about 4 nm or about 4 nm to about 8 nm according to a specific embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to a specific embodiment. At least one or each of the barrier layers has a thickness ranging from about 4 nm to about 8 nm and is configured between a pair of quantum wells or adjacent to a quantum well according to a specific embodiment. The device also has a p-type cladding material overlying the active region. The p-type cladding material is substantially free from an aluminum bearing material according to a preferred embodiment. The device optionally has a p-type material overlying the p-type cladding material.

In other embodiments, the invention provides yet an alternative optical device, which has a gallium and nitrogen containing substrate including a (30-3-1) or offcut crystalline surface region orientation. An n-type cladding material is overlying the n-type gallium and nitrogen containing material. Preferably, the n-type cladding material is substantially free from an aluminum bearing material. The device has an active region comprising at least three quantum wells, each of which has a thickness of 4 nm and greater. The device has one or more barrier layers, each of which has an n-type impurity characteristic and a thickness ranging from about 2 nm to about 4 nm or about 4 nm to about 8 nm in one or more alternative embodiments. Preferably, each of the barrier layers is configured between a pair of quantum wells according to a specific embodiment. The device also has a p-type cladding material overlying the active region according to a specific embodiment. The p-type cladding material is substantially free from an aluminum bearing material according to a specific embodiment. The device also has a p-type material overlying the p-type cladding material.

In other embodiments, the invention provides a method of fabricating an optical device, which has a gallium and nitrogen containing substrate including a (30-3-1) or offcut crystalline surface region orientation. An n-type cladding material is overlying the n-type gallium and nitrogen containing material. Preferably, the n-type cladding material is substantially free from an aluminum bearing material. The method includes forming an active region comprising at least three quantum wells, each of which has a thickness of 3.5 nm and greater. The device has one or more barrier layers, each of which has an n-type impurity characteristic and a thickness ranging from about 2 nm to about 4 nm or about 4 nm to about 8 nm in one or more alternative embodiments. Preferably, each of the barrier layers is configured between a pair of quantum wells according to a specific embodiment. The method also includes forming a p-type cladding material overlying the active region according to a specific embodiment. The p-type cladding material is substantially free from an aluminum bearing material according to a specific embodiment. The method also includes forming a p-type material overlying the p-type cladding material.

In a specific embodiment, the present invention provides an optical device, such as a laser diode. The device has a gallium and nitrogen containing substrate including a (30-3-1) or offcut crystalline surface region orientation, which may be off-cut according to one or more embodiments. The device has an n-type cladding material overlying the n-type gallium and nitrogen containing material. In a preferred embodiment, the n-type cladding material is substantially free from an aluminum bearing material. The device also has an active region comprising at least three quantum wells. In a specific embodiment, each of the quantum wells has a thickness of 3.5 nm and greater and one or more barrier layers according to a specific embodiment. Each of the barrier layers has a p-type characteristic and a thickness ranging from about 2 nm to about 3.5 nm in a specific embodiment. Each of the barrier layers has a p-type characteristic and a thickness ranging from about 3.5 nm to about 7 nm in an alternative specific embodiment. In a preferred embodiment, each of the barrier layers is configured between a pair of quantum wells. The device also has a p-type cladding material overlying the active region. Preferably, the p-type cladding material is substantially free from an aluminum bearing material. And overlying p-type material is included. In a preferred embodiment, the active region is configured for a forward voltage of less than about 6V or less than about 7V for the device for an output power of 60 mW and greater. In other embodiments for nonpolar m-plane devices or semipolar (30-3-1) planes, operable in the blue (430-475 nm) and green (505-530 nm), the present method and structure include five (5) or more thick QWs of greater than 4 or 5 nm in thickness and thin barriers that are 2 nm to 4 nm in thickness.

In one or more embodiments, the present invention includes a laser diode substantially free from an aluminum containing cladding region. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff. We have determined that the forward voltage of the diode can be reduced in multi-quantum well active regions by way of the use of thin barriers on the order of 3-4 nm, which are much thinner than conventional lasers such as those in Yoshizumi et al., "Continuous-Wave operation of 520 nm Green InGaN-Based Laser Diodes on Semi-Polar {20-21} GaN Substrates," Applied Physics Express 2 (2009) 092101. We have also determined that the forward voltage can be reduced in multi-quantum well active regions by adding p or n-type dopant species to the active region according to one or more other embodiments. Although any one or combination of these approached can be used, we believe it would be preferable to use the thin barrier approach to avoid adding impurities to the active region. The impurities may change optical losses and alter the electrical junction placement according to one or more embodiments. Accordingly, the present invention provides a laser device and method that is free from aluminum-containing cladding regions with low voltage on (30-3-1) or offcut substrates.

Moreover, the present invention provides an optical device that is substantially free from aluminum bearing cladding materials. The device has a gallium and nitrogen containing substrate member having a (30-3-1) or offcut crystalline surface region. The device has an n-type gallium and nitrogen containing cladding material. In a specific embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In a preferred embodiment, the p-type gallium and nitrogen containing cladding material is substantially free from an aluminum species. The device preferably includes a laser stripe region configured from at least the active region and characterized by a cavity orientation substantially parallel to a projection in a c-direction. The laser strip region has a first end and a second end. The device also has a first etched or etched facet provided on the first end of the laser stripe region and a second etched or etched facet provided on the second end of the laser stripe region. Depending upon the embodiment, the facets may be etched, etched, or a combination of cleaved and etched. In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like. Further details of these limitations can be found throughout the present specification and more particularly below.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures. Further benefits are described throughout the present specification and more particularly below.

In alternative example, the present invention provides a green laser diode configured using a semipolar gallium and nitrogen containing bulk substrate member, as described in more detail below, which has etched facets.

In preferred embodiments, the invention provides a laser structure without an aluminum bearing cladding region. In a specific embodiment, the laser device comprises a multi-quantum well active region having thin barrier layers, with the active region comprising three or more quantum well structures. Between each of the quantum well structures is a thin barrier layer, e.g., 8 nm and less, 7 nm and less, 6 nm and less, 5 nm and less, 4 nm and less, 3 nm and less, 2 nm and less, 1.5 nm and less. In a preferred embodiment, the combination of thin barrier layers configured in the multi-quantum well structures enables a low voltage (e.g., 7 volts and less, 6 volts and less) laser diode free from use of aluminum bearing cladding regions.

In one embodiment, the optical device has a gallium and nitrogen containing substrate including a {20-21} crystalline surface region orientation, which may be off-cut. The device preferably has an n-type cladding material overlying the n-type gallium and nitrogen containing material according to a specific embodiment. The n-type cladding material is substantially free from an aluminum bearing material. The device also has an active region comprising at least three quantum wells. Each of the quantum wells has a thickness of 2.5 nm and greater or 3.5 nm and greater and one or more barrier layers. Each of the barrier layers has a thickness ranging from about 2 nm to about 4 nm or about 3 nm to about 6.5 nm and is configured between a pair of quantum wells according to a specific embodiment. At least one or each of the barrier layers has a thickness ranging from about 2 nm to about 4 nm and is configured between a pair of quantum wells or adjacent to a quantum well according to a specific embodiment. At least one or each of the barrier layers has a thickness ranging from about 3 nm to about 6.5 nm and is configured between a pair of quantum wells or adjacent to a quantum well according to a specific embodiment. Preferably, the device has a p-type cladding material overlying the active region. Preferably, the p-type cladding material is substantially free from an aluminum bearing material according to a specific embodiment. In a preferred embodiment, the active region is configured operably for a forward voltage of less than about 7V or less than about 6V for the device for an output power of 60 mW and greater.

In yet an alternative embodiment, the present invention provides an optical device. The device has a gallium and nitrogen containing substrate including a {20-21} crystalline surface region orientation. The device also has an n-type cladding material overlying the n-type gallium and nitrogen containing material. The n-type cladding material is substantially free from an aluminum bearing material. The device further has an active region comprising at least two quantum wells. Each of the quantum wells has a thickness of 2.5 nm and greater or 3.5 nm and greater and one or more barrier layers according to a specific embodiment. Each of the barrier layers has a thickness ranging from about 2 nm to about 5 nm or about 3 nm to about 8 nm according to a specific embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to a specific embodiment. At least one or each of the barrier layers has a thickness ranging from about 3 nm to about 8 nm and is configured between a pair of quantum wells or adjacent to a quantum well according to a specific embodiment. The device also has a p-type cladding material overlying the active region. The p-type cladding material is substantially free from an aluminum bearing material according to a preferred embodiment. The device optionally has a p-type material overlying the p-type cladding material.

In other embodiments, the invention provides yet an alternative optical device, which has a gallium and nitrogen containing substrate including a {20-21} crystalline surface region orientation. An n-type cladding material is overlying the n-type gallium and nitrogen containing material. Preferably, the n-type cladding material is substantially free from an aluminum bearing material. The device has an active region comprising at least two quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The device also has a p-type cladding material overlying the active region according to a specific embodiment. The p-type cladding material is substantially free from an aluminum bearing material according to a specific embodiment. The device also has a p-type material overlying the p-type cladding material.

In other embodiments, the invention provides a method of fabricating an optical device, which has a gallium and nitrogen containing substrate including a {20-21} crystalline surface region orientation. An n-type cladding material is overlying the n-type gallium and nitrogen containing material. Preferably, the n-type cladding material is substantially free from an aluminum bearing material. The method includes forming an active region comprising at least two quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The method also includes forming a p-type cladding material overlying the active region according to a specific embodiment. The p-type cladding material is substantially free from an aluminum bearing material according to a specific embodiment. The method also includes forming a p-type material overlying the p-type cladding material.

In a specific embodiment, the present invention provides an optical device, such as a laser diode. The device has a gallium and nitrogen containing substrate including a {20-21} crystalline surface region orientation, which may be off-cut according to one or more embodiments. The device has an n-type cladding material overlying the n-type gallium and nitrogen containing material. In a preferred embodiment, the n-type cladding material is substantially free from an aluminum bearing material. The device also has an active region comprising at least two quantum wells. In a specific embodiment, each of the quantum wells has a thickness of 2.5 nm and greater and one or more barrier layers according to a specific embodiment. Each of the barrier layers has a p-type characteristic and a thickness ranging from about 2 nm to about 3.5 nm in a specific embodiment. Each of the barrier layers has a p-type characteristic and a thickness ranging from about 3.5 nm to about 7 nm in an alternative specific embodiment. In a preferred embodiment, each of the barrier layers is configured between a pair of quantum wells. The device also has a p-type cladding material overlying the active region. Preferably, the p-type cladding material is substantially free from an aluminum bearing material. And overlying p-type material is included. In a preferred embodiment, the active region is configured for a forward voltage of less than about 6 v or less than about 7V for the device for an output power of 60 mW and greater.

In one or more embodiments, the present invention includes a laser diode substantially free from an aluminum containing cladding region. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff. We have determined that the forward voltage of the diode can be reduced in multi-quantum well active regions by way of the use of thin barriers on the order of 5 nm, which are much thinner than conventional lasers such as those in Yoshizumi et al., "Continuous-Wave operation of 520 nm Green InGaN-Based Laser Diodes on Semi-Polar {20-21} GaN Substrates," Applied Physics Express 2 (2009) 092101. We have also determined that the forward voltage can be reduced in multi-quantum well active regions by adding p or n-type dopant species to the active region according to one or more other embodiments. Although any one or combination of these approached can be used, we believe it would be preferable to use the thin barrier approach to avoid adding impurities to the active region. The impurities may change optical losses and alter the electrical junction placement according to one or more embodiments. Accordingly, the present invention provides a laser device and method that is free from aluminum-containing cladding regions with low voltage on {20-21) substrates.

Moreover, the present invention provides an optical device that is substantially free from aluminum bearing cladding materials. The device has a gallium and nitrogen containing substrate member having a {20-21} crystalline surface region. The device has an n-type gallium and nitrogen containing cladding material. In a specific embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In a preferred embodiment, the p-type gallium and nitrogen containing cladding material is substantially free from an aluminum species. The device preferably includes a laser stripe region configured from at least the active region and characterized by a cavity orientation substantially parallel to a projection in a c-direction. The laser strip region has a first end and a second end. The device also has a first etched facet provided on the first end of the laser stripe region and a second etched facet provided on the second end of the laser stripe region. In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures.

In a specific embodiment on the {20-21} GaN, the device has a laser stripe region formed overlying a portion of the off-cut crystalline orientation surface region. In a specific embodiment, the laser stripe region is characterized by a cavity orientation substantially in a projection of a c-direction, which is substantially normal to an a-direction. In a specific embodiment, the laser strip region has a first end and a second end, each of which is etched. In a preferred embodiment, the device is formed on a projection of a c-direction on a {20-21} gallium and nitrogen containing substrate having a pair of etched mirror structures, which face each other.

In a preferred embodiment, the device has a first etched facet provided on the first end of the laser stripe region and a second etched facet provided on the second end of the laser stripe region. In one or more embodiments, the first etched is substantially parallel with the second etched facet. Mirror surfaces are formed on each of the etched surfaces. The first etched facet comprises a first mirror surface. In a specific embodiment, the first mirror surface comprises a reflective coating. The reflective coating is selected from silicon dioxide, hafnia, and titania, tantalum pentoxide, zirconia, including combinations, and the like. Depending upon the embodiment, the first mirror surface can also comprise an anti-reflective coating.

Also in a preferred embodiment, the second etched facet comprises a second mirror surface. In a specific embodiment, the second mirror surface comprises a reflective coating, such as silicon dioxide, hafnia, and titania, tantalum pentoxide, zirconia, combinations, and the like. In a specific embodiment, the second mirror surface comprises an anti-reflective coating.

In a specific embodiment, the laser stripe has a length and width. The length ranges from about 50 microns to about 3000 microns or preferably from about 400 microns to about 650 microns or about 650 microns to about 1200 microns. The strip also has a width ranging from about 0.5 microns to about 50 microns or preferably between 1 microns to about 1.5 microns, about 1.5 microns to about 2.0 microns, or about 2.0 microns to about 4 microns, but can be other dimensions. In a specific embodiment, the width is substantially constant in dimension, although there may be slight variations. The width and length are often formed using a masking and etching process, which are commonly used in the art.

In a specific embodiment, the present invention provides an alternative device structure capable of emitting 501 nm and greater light in a ridge laser embodiment having etched facets. The device is provided with one or more of the following epitaxially grown elements, but is not limiting.

an n-GaN cladding layer with a thickness from 100 nm to 3000 nm with Si doping level of 5E17 $cm^{-3}$ to 3E18 $cm^{-3}$;

an n-side SCH layer comprised of InGaN with molar fraction of indium of between 3% and 10% and thickness from 20 nm to 150 nm;

multiple quantum well active region layers comprised of at least two 2.0 nm to 5.5 nm InGaN quantum wells separated by thin 2.5 nm and greater, and optionally up to about 8 nm, GaN barriers;

a barrier region formed overlying the active region;

a p-side SCH layer comprised of InGaN with molar a fraction of indium of between 1% and 10% and a thickness from 15 nm to 100 nm;

an electron blocking layer comprised of AlGaN with molar fraction of aluminum of between 5% and 20% and thickness from 5 nm to 20 nm and doped with Mg;

a p-GaN cladding layer with a thickness from 400 nm to 1000 nm with Mg doping level of 2E17 $cm^{-3}$ to 2E19 $cm^{-3}$; and a p++-GaN contact layer with a thickness from 20 nm to 40 nm with Mg doping level of 1E19 $cm^{-3}$ to 1E21 $cm^{-3}$.

Of course there can be other embodiments such as the use of p-side GaN guiding layer in place of the p-SCH, the use of multiple different layers in the SCH regions, or the omission of the EBL layer.

In an example, a laser device is fabricated on a {20-21} substrate according to an embodiment of the present invention. The laser device includes gallium nitride substrate, which has an underlying n-type metal back contact region. In a specific embodiment, the metal back contact region is made of a suitable material such as those noted below and others. Further details of the contact region can be found throughout the present specification, and more particularly below.

In a specific embodiment, the device also has an overlying n-type gallium nitride layer, an active region, and an overlying p-type gallium nitride layer structured as a laser stripe region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ $cm^{-3}$ and $10^{20}$ $cm^{-3}$.

In a specific embodiment, an n-type $Al_uIn_vGa_{1-u-v}N$ layer, where $0 \le u$, v, $u+v \le 1$, is deposited on the substrate. In a specific embodiment, the carrier concentration may lie in the range between about $10^{16}$ $cm^{-3}$ and $10^{20}$ $cm^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 900 to 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In a specific embodiment, the laser stripe region is made of the p-type gallium nitride layer. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes contact region. In a specific embodiment, the dielectric region is an oxide such as silicon dioxide or silicon nitride, but can be others. The contact region is coupled to an overlying metal layer. The overlying metal layer is a multilayered structure containing gold and platinum (Pt/Au), nickel gold (Ni/Au), but can be others.

In a specific embodiment, the laser device has active region. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may be comprised of multiple quantum wells, with 2-10 quantum wells. The quantum wells may be comprised of InGaN with GaN barrier layers separating them. In other embodiments, the well layers and barrier layers comprise $Al_wIn_xGa_{1-w-x}N$ and $Al_yIn_zGa_{1-y-z}N$, respectively, where $0 \leq w$, x, y, z, w+x, y+z $\leq 1$, where w<u, y and/or x>v, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s$, t, s+t $\leq 1$, with a higher bandgap than the active layer, and may be doped p-type. In one specific embodiment, the electron blocking layer comprises AlGaN. In another embodiment, the electron blocking layer comprises an AlGaN/GaN superlattice structure, comprising alternating layers of AlGaN and GaN, each with a thickness between about 0.2 nm and about 5 nm.

In a specific embodiment, the action region structure does not include an AlGaN EBL layer. That is, the laser device is free from any electron blocking layer, which is optional in such embodiment.

As noted, the p-type gallium nitride structure is deposited above the electron blocking layer and active layer(s). The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes a contact region. In a specific embodiment, the dielectric region is an oxide such as silicon dioxide.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

In an example, a laser device includes a starting material such as a bulk nonpolar or semipolar GaN substrate, but can be others. In a specific embodiment, the device is configured to achieve emission wavelength ranges of 390 nm to 420 nm, 420 nm to 440 nm, 440 nm to 470 nm, 470 nm to 490 nm, 490 nm to 510 nm, and 510 nm to 530 nm, but can be others.

In a preferred embodiment, the growth structure is configured using between 3 and 5 or 5 and 7 quantum wells positioned between n-type GaN and p-type GaN cladding layers. In a specific embodiment, the n-type GaN cladding layer ranges in thickness from 500 nm to 2000 nm and has an n-type dopant such as Si with a doping level of between 1E18 cm$^{-3}$ and 3E18 cm$^{-3}$. In a specific embodiment, the p-type GaN cladding layer ranges in thickness from 500 nm to 1000 nm and has a p-type dopant such as Mg with a doping level of between 1E17 cm$^{-3}$ and 7E19 cm$^{-3}$. In a specific embodiment, the Mg doping level is graded such that the concentration would be lower in the region closer to the quantum wells.

In a specific preferred embodiment, the quantum wells have a thickness of between 2.5 nm and 4 nm, 4 nm and 5.5 nm or 5.5 nm and 8 nm, but can be others. In a specific embodiment, the quantum wells would be separated by barrier layers with thicknesses between 2 nm and 3.5 nm or 3.5 nm and 6 nm or 6 nm and 8 nm. The quantum wells and the barriers together comprise a multiple quantum well (MQW) region.

In a preferred embodiment, the device has barrier layers formed from GaN, InGaN, AlGaN, or InAlGaN. In a specific embodiment using InGaN barriers, the indium contents range from 0% to 5% (mole percent), but can be others. Also, it should be noted that % of indium or aluminum is in a molar fraction, not weight percent.

An InGaN separate confinement heterostructure layer (SCH) could be positioned between the n-type GaN cladding and the MQW region according to one or more embodiments. Typically, such separate confinement layer is commonly called the n-side SCH. The n-side SCH layer ranges in thickness from 10 nm to 60 nm or 60 nm to 150 nm and ranges in indium composition from 1% to 12% (mole percent), but can be others. In a specific embodiment, the n-side SCH layer may be doped with an n-type dopant such as Si.

In yet another preferred embodiment, an InGaN separate confinement heterostructure layer (SCH) is positioned between the p-type GaN cladding and the MQW region, which is called the p-side SCH. In a specific embodiment, the p-side SCH layer ranges in thickness from 10 nm to 40 nm or 40 nm to 150 nm and ranges in indium composition from 0% to 10% (mole percent), but can be others. The p-side SCH layer may be doped with a p-type dopant such as Mg.

In another embodiment, the structure would contain both an n-side SCH and a p-side SCH. In another embodiment the p-side SCH would be replaced with p-side GaN guiding layer. In another embodiment the n-side and/or p-side SCH regions would contain multiple layers.

In another embodiment, the structure would contain a GaN guiding layer on the p-side positioned between the p-type GaN cladding layer and the MQW region. This GaN guiding layer could range in thickness from 10 nm to 60 nm and may or may not be doped with a p-type species such as Mg.

In a specific preferred embodiment, an AlGaN electron blocking layer, with an aluminum content of between 5% and 20% (mole percent), is positioned between the MQW and the p-type GaN cladding layer either between the MQW and the p-side SCH, within the p-side SCH, or between the p-side SCH and the p-type GaN cladding. The AlGaN electron blocking layer ranges in thickness from 5 nm to 20 nm and is doped with a p-type dopant such as Mg from 1E17 $cm^{-3}$ and 1E21 $cm^{-3}$ according to a specific embodiment. In other embodiments, the electron blocking layer is free from any aluminum species and/or may be eliminated altogether. In yet another embodiment, the device would be substantially free from an electron blocking layer.

Preferably, a p-contact layer positioned on top of and is formed overlying the p-type cladding layer. The p-contact layer would be comprised of GaN doped with a p-dopant such as Mg at a level ranging from 1E20 $cm^{-3}$ to 1E22 $cm^{-3}$.

In an example, a laser device has a gallium and nitrogen containing substrate member (e.g., bulk gallium nitride) having a {20-21} crystalline surface region or other surface configuration. The device has an n-type gallium and nitrogen containing cladding material. In a specific embodiment, the n-type gallium and nitrogen containing cladding material is substantially free from an aluminum species, which leads to imperfections, impurities, and other limitations. In one or more preferred embodiment, the cladding material has no aluminum species and is made of a gallium and nitrogen containing material.

In a specific embodiment, the device also has an active region including multiple quantum well structures overlying the n-type gallium and nitrogen containing cladding material. In one or more embodiments, the active regions can include those noted, as well as others. That is, the device can include InGaN/InGaN and/or InGaN/GaN active regions, among others. In a specific embodiment, the optical can include seven MQW, six MQW, five MQW, four MQW, three MQW, more MQW, or fewer, and the like.

In a specific embodiment, the device has a p-type gallium and nitrogen containing cladding material overlying the active region. In a preferred embodiment, the p-type gallium and nitrogen containing cladding material is substantially free from an aluminum species, which leads to imperfections, defects, and other limitations. In one or more preferred embodiment, the cladding material has no aluminum species and is made of a gallium and nitrogen containing material.

In a specific embodiment, the device preferably includes a laser stripe region configured from at least the active region and characterized by a cavity orientation substantially parallel to a projection in a c-direction. Other configurations may also exist depending upon the specific embodiment. The laser strip region has a first end and a second end or other configurations. In a specific embodiment, the device also has a first etched facet provided on the first end of the laser stripe region and a second etched facet provided on the second end of the laser stripe region.

In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures. Further details of the present laser configured on {20-21} can be found in U.S. Application Publication No. 2011/0064101, which is incorporated by reference herein.

In an example, a gallium and nitrogen containing laser device configured on either a nonpolar or a semipolar surface orientation. The device has a gallium and nitrogen containing substrate member and a cladding region overlying the substrate member. In an example, the device has a cavity region formed overlying the cladding region and configured in alignment in substantially a c-direction or a projection of the c-direction. Preferably, a cavity region is characterized by a first end and a second end. In an example, the device has a first optical coating formed overlying the first facet, wherein the first coating overlying the first facet is configured to increase a reflectivity and a second optical coating formed overlying the second facet, wherein the second coating layer overlying the second facet is configured to reduce a reflectivity. The device has an optical power density characterizing the laser device, the laser device being substantially free from COMD related failure.

In an example, the nonpolar or semipolar surface orientation comprises an m-plane, a (30-31) plane, a (20-21) plane, a (30-32) plane, a (30-3-1) plane, a (20-2-1) plane, a (30-3-2) plane, or an offcut of within +/−5 degrees of any of these planes toward an a-direction or a c-direction; the cladding region being substantially free from Al-containing material, the cladding region being characterized by an AlN mol fraction in the cladding region of less than about 2%. In an example, the first optical coating is provided by a method selected from electron-beam deposition, thermal evaporation, PECVD, sputtering, and a combination of any of the foregoing. In other examples, the present invention also includes related methods reciting the same or similar elements.

In an example, the device comprises an output cavity width of greater than about 3 μm and less than about 25 μm, and is operable at over 1 W or wherein the device comprises an output cavity width of greater than about 3 μm and less than about 25 μm and is operable at over 2 W or wherein the device comprises an output cavity width of greater than about 3 μm and less than about 35 μm, and is operable at over 3 W or wherein the device comprises an output cavity width of greater than about 3 μm and less than about 35 μm, and is operable at over 4.5 W or wherein the device comprises an output cavity width of greater than about 3 μm and less than about 50 μm and is operable at over 3 W. In an example, the device is substantially free from COMD for power levels greater than 100 mW per micron of output cavity width, 200 mW per micron of output cavity width, or 400 mW per micron of output cavity width.

Finally, it should be noted that there are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above toward an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above toward an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. Pat. No. 8,427,590, which is incorporated by reference in its entirety.

In other embodiments, the present laser device can be configured in a variety of applications. Such applications include laser displays, metrology, communications, health care and surgery, information technology, and others. As an example, the present laser device can be provided in a laser display such as those described in U.S. application Ser. No. 12/789,303 filed on May 27, 2010, which is incorporated by reference in its entirety.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations. For semipolar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. In other embodiments, cleaved facets can be configured on the laser stripe. The cleaved facets can be made by scribe and break or a skip scribing process, although there can be variations.

Although the embodiments above have been described in terms of a laser diode, the methods and device structures can also be applied to any light emitting diode device. Therefore, the above description and illustrations should not be taken as limiting the scope of the present invention which is defined by the appended claims.

What is claimed is:

1. An electronic apparatus comprising:
   a gallium and nitrogen containing laser diode device, the device comprising:
   a gallium and nitrogen containing substrate material comprising a surface region, the surface region being configured on either a non-polar {10-10} crystal orientation or a semi-polar ({10-10} crystal orientation configured with an offcut at an angle toward or away from the [0001] direction);
   a GaN region formed overlying the surface region;
   an active region formed overlying the surface region;
   a gettering region comprising a magnesium species overlying the surface region;
   a p-type cladding region comprising an (InAl)GaN material doped with a plurality of magnesium species formed overlying the active region; and
   a package coupled to the gallium and nitrogen containing laser device.

2. The apparatus of claim 1, where the semipolar plane is selected from one of a {30-3-1} plane, a {30-31} plane, a {20-2-1} plane, a {20-21} plane, a {30-3-1} plane, a {30-32} plane, or an offcut from any one of these planes within +/−5 degrees toward an a-plane or a c-plane.

3. The apparatus of claim 1, further comprising an electron blocking region between the gettering region and the p-type cladding region.

4. The apparatus of claim 3, wherein the electron blocking region comprises a material selected from AlGaN and InAlGaN, and the material is characterized by an AlN mole fraction ranging from 5% to 35%; or wherein the electron blocking region comprises a material selected form AlGaN and AlInGaN, and the material configured with a wider band gap than a barrier region configured within a vicinity of the electron blocking region.

5. The apparatus of claim 3, wherein the electron blocking region is doped with a magnesium concentration between $5E18$ $cm^{-3}$ and $5E19$ $cm^{-3}$; and the electron blocking region and the p-type cladding region are epitaxially grown at a temperature above about 900° C.

6. The apparatus of claim 3, wherein the electron blocking region is substantially free from magnesium doping; or wherein the electron blocking region comprises a material selected from GaN, InAlN, AlInGaN, and a combination of any of the foregoing.

7. The apparatus of claim 1, further comprising a barrier region between the active region and the gettering region, wherein the barrier region comprises a layer selected from a GaN layer, an InGaN layer, and a combination thereof.

8. The apparatus of claim 1, further comprising a separate confinement heterostructure region between the active region and the gettering region, wherein the separate confinement heterostructure region is configured to confine an optical mode and comprises an InGaN layer.

9. The apparatus of claim 1, wherein the p-type cladding region comprises a plurality of layers, each of the plurality of layers independently selected from a GaN layer, an AlGaN layer, and an InAlGaN layer, where in each of the plurality of layers is independently doped with a concentration of magnesium ranging from $5E17$ $cm^{-3}$ to $3E19$ $cm^{-3}$.

10. The apparatus of claim 1, wherein the gettering region comprises a magnesium species doped to increase incorporation of unintentionally incorporated magnesium from a first concentration to a second concentration.

11. The apparatus of claim 1, wherein the active region comprises InGaN quantum wells configured to emit in a blue 430 nm-480 nm wavelength range or in a green 500 nm-540 nm wavelength range.

12. The apparatus of claim 1, wherein the active region comprises a plurality of quantum well regions.

13. The apparatus of claim 1, wherein the p-type cladding region comprises a single layer; the p-type region comprises multiple regions; the active region comprises one or more light emitting layers, each of the one or more lighting emitting layers being configured between a pair of barrier regions, each of the one or more lighting emitting layers having a thickness ranging from 2 nm to about 8 nm; and wherein each of the barrier regions has a thickness ranging from 2 nm to 20 nm or from 2 nm to 4 nm or 4 to 20 nm.

14. The apparatus of claim 1, further comprising a GaN barrier region and wherein the p-type cladding region is a GaN p-cladding region substantially free from an aluminum bearing species.

15. The apparatus of claim 1, wherein the p-type cladding region is a GaN p-cladding doped with a Mg concentration of less than 2E19 $cm^{-3}$ or less than about 5E18 $cm^{-3}$.

16. The apparatus of claim 3, wherein the electron blocking region and at least a portion of the p-type cladding region are epitaxially grown at a temperature above about 900° C. and the gettering region is provided at a temperature of less than about 850° C.; or wherein at least a portion of the p-type cladding region is epitaxially grown at a temperature above about 900° C. and the gettering region is provided at a temperature of less than about 900° C.; or wherein at least a portion of the p-type cladding region is epitaxially grown at a temperature above about 900° C. and the gettering region is provided at a temperature of less than about 850° C.

17. The apparatus of claim 1, wherein at least a portion of the p-type cladding region is epitaxially grown at a temperature above about 950° C. and the gettering region is provided at a temperature of less than about 850° C.; or wherein at least a portion of the p-type cladding region is epitaxially grown at a temperature above 1,000° C. and the gettering region is provided at a temperature of less than about 850° C.

18. The apparatus of claim 1, wherein the gettering region comprises:
   a region intentionally doped with Mg; and
   a region unintentionally doped with Mg region wherein the unintentionally doped region is configured to incorporate residual Mg before formation of the p-type region.

19. The apparatus of claim 1, wherein the gettering region is characterized by a thickness from 2 nm to 50 nm; or wherein the gettering region comprises a material selected from GaN, AlGaN, InAlGaN, and a combination of any of the foregoing.

20. The apparatus of claim 1, wherein the apparatus is selected from one of a display device, a metrology device, a communication device, an information device, or any combination of these devices.

* * * * *